United States Patent
Feldstein et al.

(10) Patent No.: US 8,724,343 B2
(45) Date of Patent: May 13, 2014

(54) HI-DEFINITION MULTIMEDIA INTERFACE SHIELD WITH FINGERS

(75) Inventors: Wendy Feldstein, Old Tappan, NJ (US); Gregory Sorrentino, Brewster, NY (US)

(73) Assignee: Crestron Electronics Inc., Rockleigh, NJ (US)

( * ) Notice: Subject to any disclaimer, the term of this patent is extended or adjusted under 35 U.S.C. 154(b) by 253 days.

(21) Appl. No.: 13/195,196

(22) Filed: Aug. 1, 2011

(65) Prior Publication Data

US 2012/0327630 A1 Dec. 27, 2012

Related U.S. Application Data

(60) Provisional application No. 61/501,421, filed on Jun. 27, 2011.

(51) Int. Cl.
*H05K 9/00* (2006.01)

(52) U.S. Cl.
USPC . 361/818; 361/616; 439/607.13; 439/607.17; 439/607.24; 439/607.35; 439/607.47; 439/620.1; 439/620.12; 439/620.15; 439/620.19

(58) Field of Classification Search
USPC ........... 361/818; 439/607.01, 607.04, 607.35, 439/607.4, 939, 607.28, 607.13, 607.1, 439/607.12; 174/350, 355
See application file for complete search history.

(56) References Cited

U.S. PATENT DOCUMENTS

| | | | |
|---|---|---|---|
| 4,236,779 A | 12/1980 | Tang | |
| 4,239,318 A | 12/1980 | Schwartz | |
| 4,512,623 A | 4/1985 | Tomsa | |
| 4,703,133 A | 10/1987 | Miller | |
| 5,628,653 A | 5/1997 | Haas et al. | |
| 6,005,186 A * | 12/1999 | Bachman | 174/377 |
| 6,095,862 A * | 8/2000 | Doye et al. | 439/607.11 |
| 6,454,603 B2 * | 9/2002 | Casey et al. | 439/607.28 |
| 6,932,640 B1 | 8/2005 | Sung | |
| 7,270,570 B1 | 9/2007 | Hamner et al. | |
| 7,952,890 B2 | 5/2011 | Myers et al. | |
| 2003/0152331 A1 * | 8/2003 | Dair et al. | 385/59 |
| 2006/0036788 A1 | 2/2006 | Galang et al. | |
| 2011/0039447 A1 * | 2/2011 | Lai et al. | 439/527 |

* cited by examiner

*Primary Examiner* — Tuan T Dinh
*Assistant Examiner* — Mukund G Patel
(74) *Attorney, Agent, or Firm* — Crestron Electronics Inc.

(57) ABSTRACT

An electromagnetic shield comprises a sheet of metal having slots along an edge of the sheet to form a plurality of resilient fingers. The single sheet is bent around first and second bends axes inwardly and approximately ninety degrees to form a top planar surface and first and second side walls. The single sheet of metal is sized and dimensioned to receive a connector in between the first and second side walls and top planar surface. The fingers are bent outward with a bend radius of approximately 0.020 inches with respect to a flat surface of the sidewalls and top planar surface. The fingers apply a biasing force against a surface of a faceplate. Each of the side walls includes an elongated leg, which is interconnected with a circuit board and each of the elongated legs extends beyond a bottom edge of each of the side walls.

14 Claims, 6 Drawing Sheets

HI-DEFINITION MULTIMEDIA INTERFACE SHIELD WITH FINGERS

BACKGROUND OF THE INVENTION

1. Technical Field

The present invention relates generally to a shielding member. More particularly, the invention relates to a radio frequency and electromagnetic interference shielding member for a Hi-Definition Multimedia Interface (HDMI) connector, which is easy to assemble.

2. Background Art

Electromagnetic interference (EMI) shielded cables and connector assemblies are frequently used for the transmission of data signals between programmable instruments, such as computers and the like, as well as in other environments wherein electrical and electromagnetic radiation can be expected to interfere with the electrical signal carried by the interconnecting cables and connector assemblies. Shielding has been used for years in electrical connectors to keep unwanted radio frequency and electromagnetic signals (RFI/EMI) and electromagnetic pulses (EMP) from interfering with signals being carried by contacts in connectors. Such cables typically use a flexible plastic film that can be trimmed to any desired shape or size as shielding material. A clear liner can be removed to expose adhesive for attachment to a cable connector, such as a Hi-Definition Multimedia Interface (HDMI) connector.

HDMI is a transmission interface developed for next generation multimedia audio/video systems including DVD players, game box converters, TV boxes, etc. The maximum transmission speed of an HDMI interface can be as high as 5 Gb/s. In addition to a video signal, an HDMI interface can simultaneously transmit an 8-channel audio signal. Because HDMI is practical for transmitting digital data without compression, it effectively reduces signal interference and attenuation due to conversion between digital signal and analog signal. An HDMI connector is a small-size connector developed following the step of SATA (Serial AT attachment) interface connector.

Accordingly, it is the object of the present invention to provide an RFI, EMI and/or EMP shield for an HDMI connector.

SUMMARY OF THE INVENTION

It is to be understood that both the general and detailed descriptions that follow are exemplary and explanatory only and are not restrictive of the invention.

DISCLOSURE OF INVENTION

Principles of the invention provide an RFI, EMI and/or EMP shield for an HDMI connector. For example, in a first aspect of the invention, an electromagnetic shield for use on an HDMI connector comprises a single sheet of metal having slots along an edge of the sheet to form a plurality of resilient fingers. The sheet of metal is bent around first and second bend axes inwardly and approximately ninety degrees to form a top planar surface and first and second side walls. The single sheet of metal is sized and dimensioned to receive the HDMI connector in between the first and second side walls and top planar surface. The plurality of resilient fingers are bent outward with a bend radius of approximately 0.020 inches with respect to a flat surface of the sidewalls and top planar surface, respectively. The plurality of fingers applies a biasing force against a surface of a faceplate. Each of the side walls includes an elongated leg that is interconnected with a circuit board. Each of the elongated legs extends beyond a bottom edge of each of the side walls. Each leg is substantially perpendicular to the plurality of fingers on the respective side walls.

In a second aspect of the invention, an electromagnetic shield for use on an HDMI connector comprises a tin plated beryllium copper alloy single sheet of metal having slots along an edge of the sheet to form a plurality of resilient fingers. The single sheet of metal is bent around first and second bend axes inwardly and approximately ninety degrees to form a top planar surface and first and second side walls. The single sheet of metal is sized and dimensioned to receive the HDMI connector in between the first and second side walls and top planar surface. The plurality of resilient fingers are bent outward with a bend radius of approximately 0.020 inches with respect to a flat surface of the sidewalls and top planar surface, respectively. The plurality of fingers applies a biasing force against a surface of a faceplate. Each of the side walls includes an elongated leg that is interconnected with a circuit board. Each of the elongated legs extends beyond a bottom edge of each of the side walls. Each leg is substantially perpendicular to the plurality of fingers on the respective side walls.

The present invention seeks to overcome or at least ameliorate one or more of several problems, including but not limited to: prevent EMI from interfering with signal being carried by contacts in an HDMI connector.

BRIEF DESCRIPTION OF DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

BRIEF DESCRIPTION OF THE SEVERAL VIEWS OF THE DRAWINGS

Figure 1:
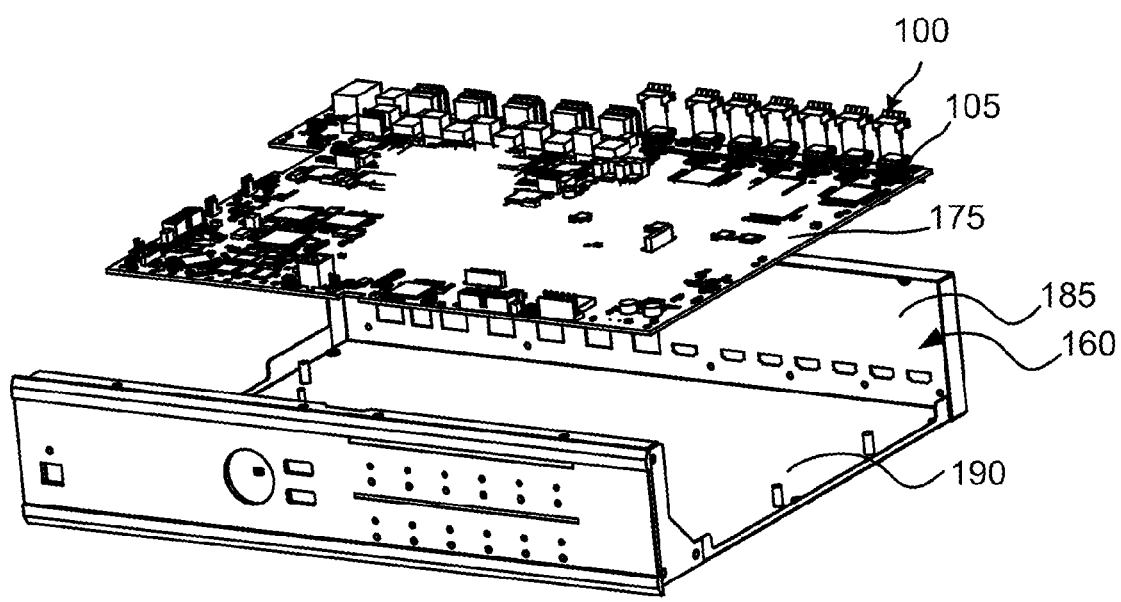
Figure 2:
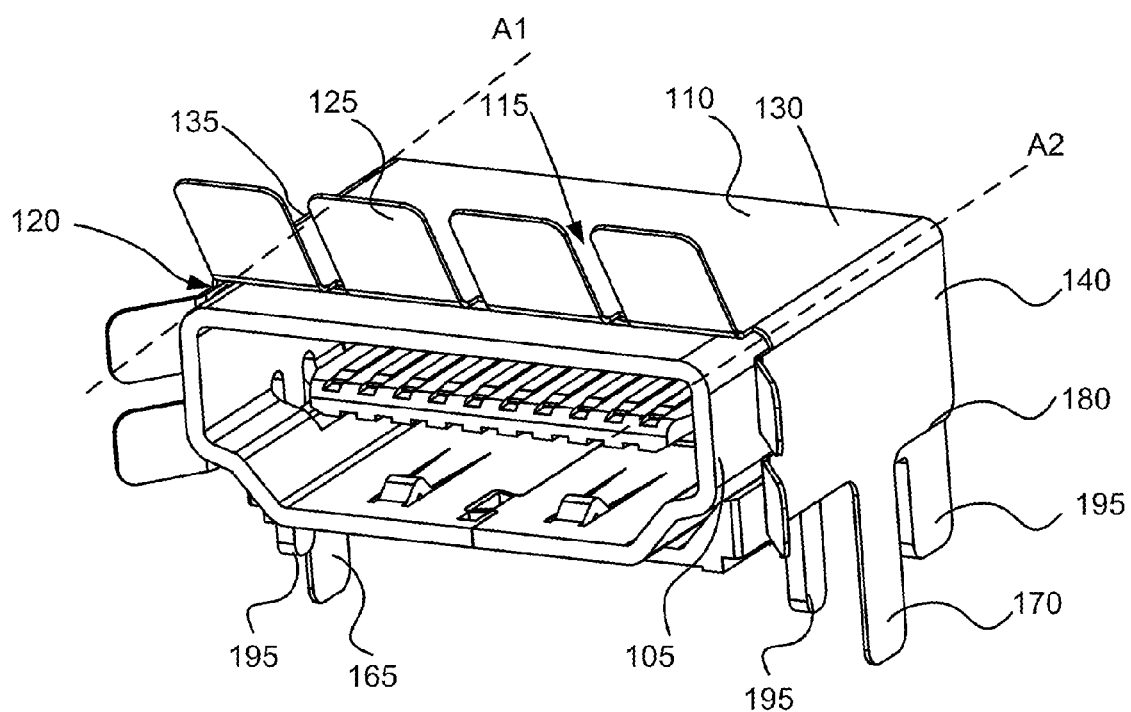

FIG. 1 is an exploded perspective view of an electromagnetic shield for use on an HDMI connector, which is mounted onto a printed circuit board in accordance with an illustrative embodiment of the present invention FIG. 2 is a pictorial view of the electromagnetic shield with the HDMI connector in accordance with an illustrative embodiment of the present invention.

Figure 3:
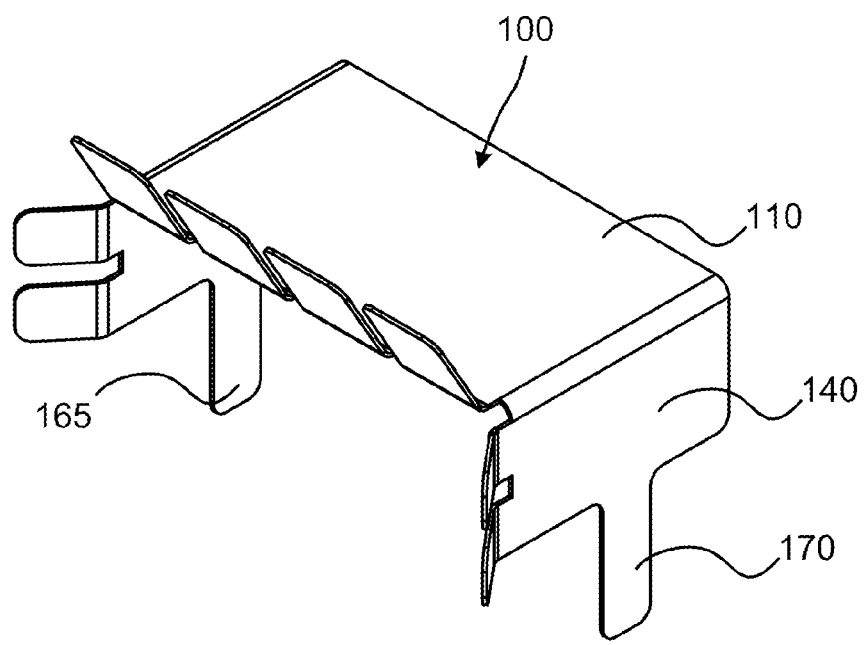

FIG. 3 is a pictorial view of the electromagnetic shield in accordance with an illustrative embodiment of the present invention.

Figure 4:
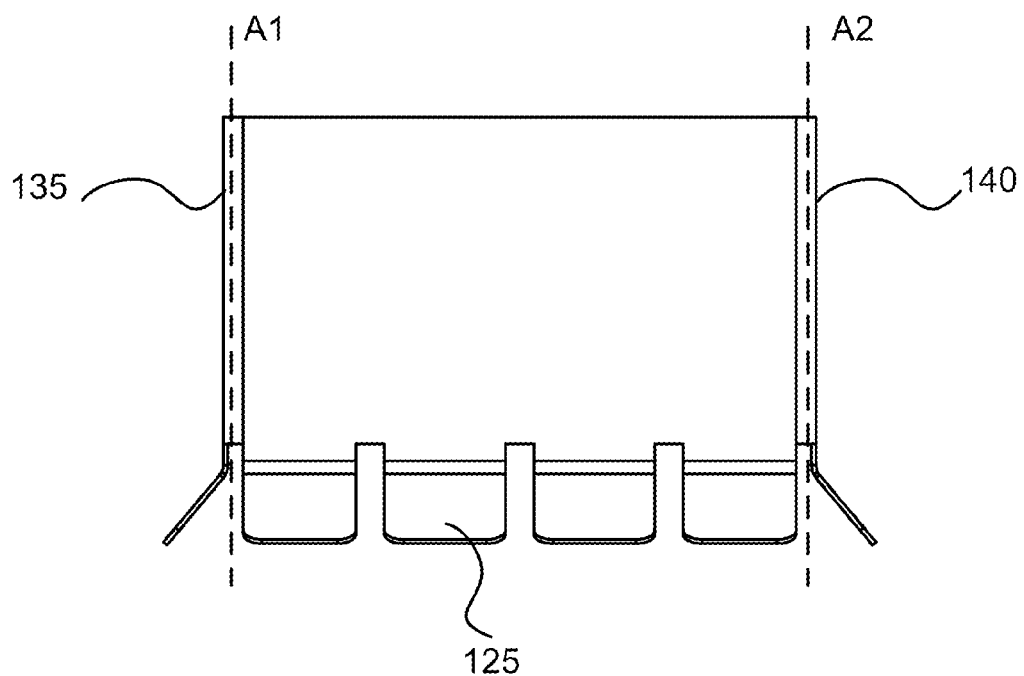

FIG. 4 is a top view of the electromagnetic shield in accordance with an illustrative embodiment of the present invention.

Figure 5:
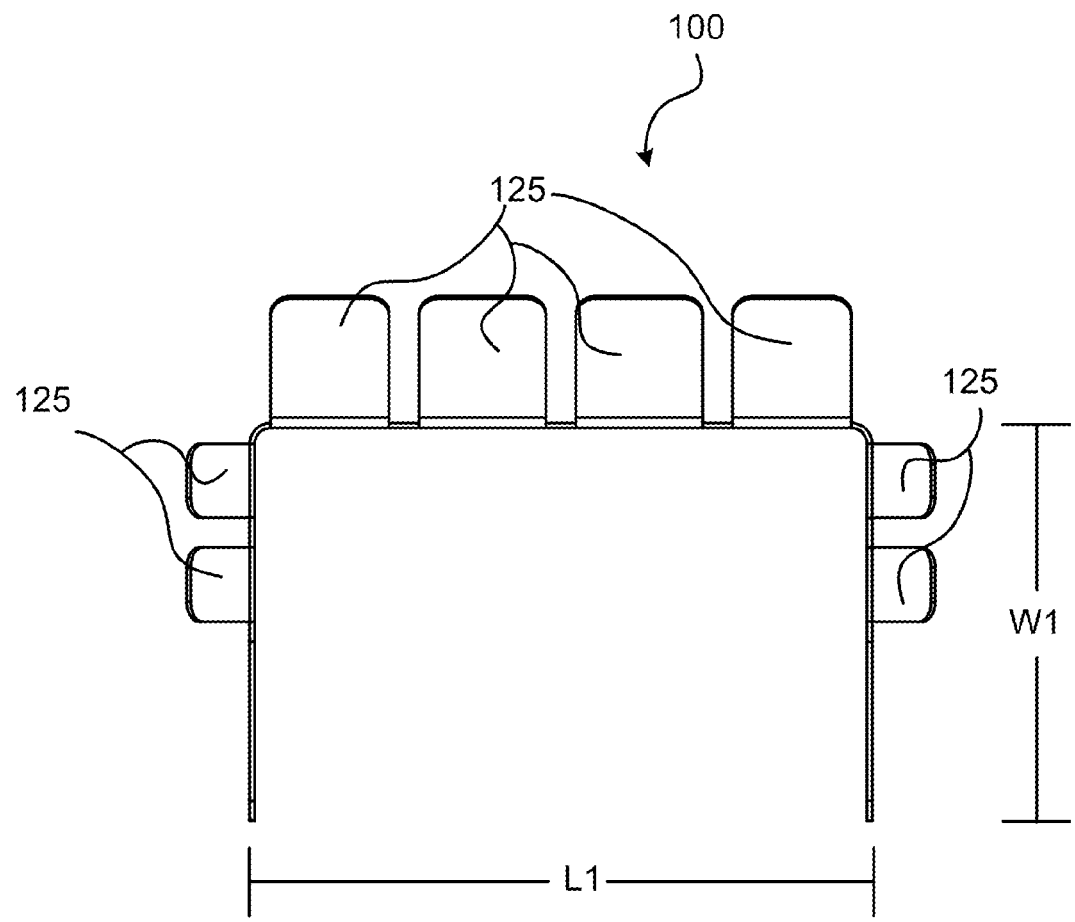

FIG. 5 is a front view of the electromagnetic shield in accordance with an illustrative embodiment of the present invention.

Figure 6:
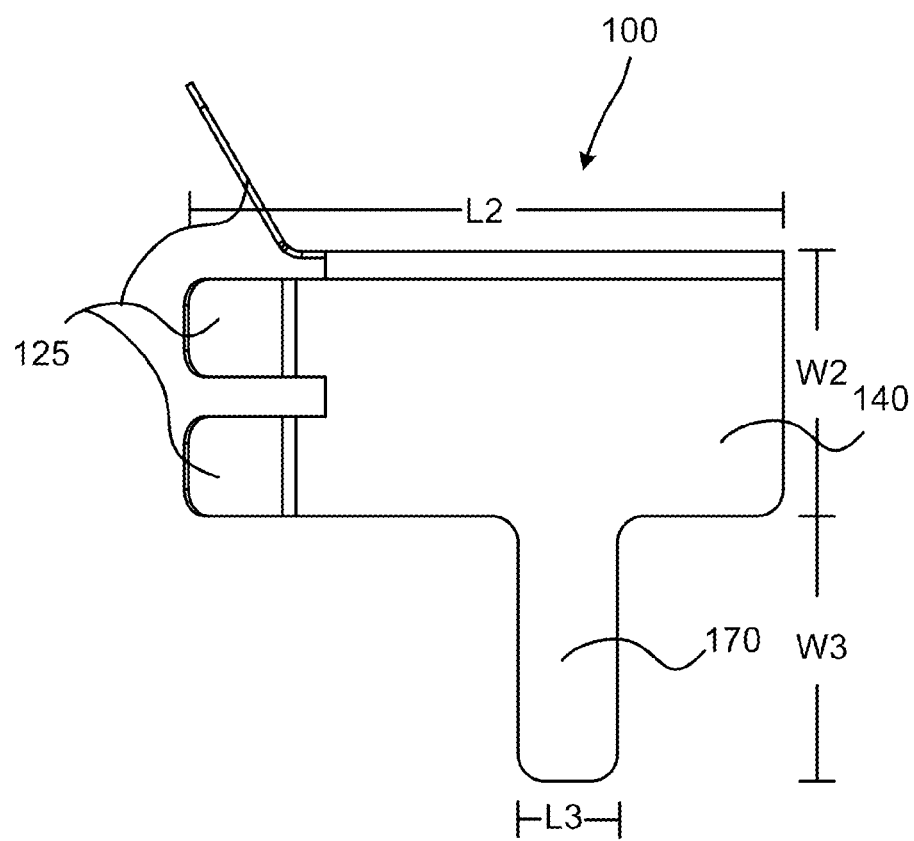

FIG. 6 is a side-view of the electromagnetic shield in accordance with an illustrative embodiment of the present invention.

LIST OF REFERENCE NUMBERS FOR THE MAJOR ELEMENTS IN THE DRAWING

The following is a list of the major elements in the drawings in numerical order.

A1 first bend axis
A2 second bend axis
100 electromagnetic shield
105 HDMI connector
115 slots
120 edge of the sheet
125 fingers
130 top planar surface
135 first side wall
140 second side wall
160 faceplate
165 leg of the first side wall
170 leg of the second side wall
175 printed circuit board
180 bottom edge of each of the first and second side walls
185 surface of a faceplate

DETAILED DESCRIPTION OF THE INVENTION

Mode(s) for Carrying Out the Invention

The present invention relates to a radio frequency and electromagnetic interference shield for a Hi-Definition Multimedia Interface (HDMI) connector.

FIG. 1 is an exploded perspective view of an illustrative electromagnetic shield 100 with an HDMI connector 105 on an electronic printed circuit board 175 in accordance with one embodiment of the invention. The printed circuit board 175 may be installed onto a chassis 190 having a faceplate 160. The shield 100 makes a ground contact with a surface 185 of the faceplate 160 via the circuit board 175.

Referring to FIG. 2, the shield 100 is formed from a single sheet 110 of metal with an edge 120 bent around the first and second bend axes A1, A2 inwardly and approximately ninety degrees to form a top planar surface 130 and first and second sidewalls 135, 140. To this end, the sheet 110 forms a substantially U-shaped geometry. The sheet 110 includes slots 115 along one of the longitudinal edge 120 of the metal sheet 110 to form a plurality of resilient fingers 125. The fingers 125 are bent outward with a bend radius of approximately 0.020 inches with respect to a flat surface of the first and second sidewalls 135, 140 and top planar surface 130, respectively. The fingers 125 apply a biasing force against the surface 185 of the faceplate 160.

The single sheet 110 of metal is sized and dimensioned to receive the HDMI connector 105 in between the first and second side walls 135, 140 and top planar surface 130. Each of the side walls 135, 140 includes an elongated leg 165, 170 that extends beyond a bottom edge 180 of each of the side walls 135, 140. The shield 100 is operatively coupled to the circuit board 175 to provide an interconnection between the shield 100 and the circuit board 175 such as a ground plane on the board 175. The side walls 135, 140 with the legs 165, 170 are coupled to the circuit board 175 using any suitable approach. For example, the legs 165, 170 may be inserted into holes located on the circuit board 175 and soldered into the circuit board 175, snapped, clipped or mechanically fastened into a structural element of the circuit board 175, or attached using any other suitable approach. In some embodiments, the side walls 135, 140 and top planar surface frame 130 may be separate metal components that are combined into a single piece of shield 100.

Shield 100 may be placed on any suitable portion of the circuit board 175 to surround the HDMI connector 105, which emits electromagnetic radiation or is susceptible to electromagnetic radiation. Once the shield 100 is placed over the HDMI connector 105, the HDMI connector 105 is enclosed by the side walls 135, 140 and top planar cover 130, thus preventing interfering radiation from escaping and damaging the HDMI connector 105 and/or other components. The shield 100 can be installed or removed individually onto/from the circuit board 175 for easy access to the HDMI connector 105 (e.g., for repair) without disturbing the HDMI connector 105 and/or other components that may be sensitive to interferences. The HDMI connector 105 may have four legs 195 that are inserted into holes created on the circuit board to provide a ground terminal connection.

Once the HDMI connector 105 is installed onto the circuit board 175 with the faceplate 160 (FIG. 1), at least a portion of the fingers 125 flex and make contact with the faceplate 160 for a ground connection. Advantageously, the resilient fingers 125 apply a biasing force against the surface 185 (FIG. 1) of the faceplate 160 for the ground connection. The fingers 125 may be flexibly biased towards the surface 185 of the faceplate 160 such that the fingers 125 may deflect when they are placed against the surface 185 of the faceplate 160, thus creating tension onto the surface 185. If the fingers 125 are removed from installation, the finger 125 may bend back to its normal or non-tensed position or may take a minimal set but will remain functional. In other words, the fingers 125 maintain the same bent radius even after being bent to another radius when the shield 100 is installed. This allows the shield 100 to be re-usable instead of being a one-time use component. Further, since the shield 100 is installed onto the HDMI connector 105 separately, the shield 100 can be sold as an off the shelf product without the HDMI connector 100. Moreover, if the HDMI connector is damaged, the reusable shield 100 can be reinstalled onto another HDMI connector without having to throw away a shield that is integrated with an HDMI connector. This saves raw material cost by not wasting an otherwise functional shield just because of a bad connector.

The shield 100 may be coupled to the HDMI connector 105 and circuit board 175 using any suitable approach. In one embodiment, the legs 165, 170 may be soldered to the circuit board 175. In other embodiments, once the connector 105 is soldered onto the circuit board 175, the shield 100 may include snaps (not shown) to engage a portion of the side walls of the connector 105. Snaps may include one or more mechanisms for engaging the side walls of the connector. For example, snaps may be elastically biased towards the side walls of the connector 105 such that the snaps may deflect when they are placed over the connector 105, thus creating an interference or frictional fit. As another example, snaps may include a tab or protrusion, operative to engage a corresponding indentation or tab, respectively, in the side walls of the connector 105. As still another example, a tape, adhesive or mechanical fastener (e.g., a screw may pass through the snaps and engage the side walls of the connector 105 and/or circuit board 175.

Each shield 100 may include any suitable number of fingers 125 with slots 115 equally spaced in-between each finger 125. Referring to FIGS. 3-6, in one embodiment, there are four fingers 125 extending from the top planar surface 130 and two fingers 125 extending from each side walls 135, 140. The fingers 125 on the top planar surface 130 may have longer lengths and widths than the fingers 125 of the side walls 135, 140. The amount of contacts the fingers 125 can make with the surface 185 of the faceplate 160 depends on the placement of the shield 100 onto the connector 105.

Each of the plurality of resilient fingers 125 is independently flexible, and thus can accommodate non-uniform thicknesses of the surface 185 of the faceplate 160. Some faceplates may have uneven surfaces and therefore the shield 100 can accommodate such uneven surfaces. Each of the plurality of resilient fingers 125 is able to transition between a non-flexed state and a flexed state. The flexed state is when the finger 125 biases the surface 185 of the faceplate 160 and the non-flexed state is when the finger 125 does not apply a force onto the surface 185.

Before fixedly coupling the shield 100 over the connector to the circuit board 175, the connector 105 with the fingers 125 slides away or towards the surface 185 of the faceplate 160 so as to vary the amount of force the fingers apply to the surface 185. This enables the shield 100 to accommodate varying faceplate 160 thicknesses while the fingers 125 maintain contact with the surface 185 of the faceplate 160.

The shield 100 may be manufactured from any suitable material operative to shield the connector 105 and/or other components from electromagnetic interference (e.g., from other components of the electronic device). In one embodiment, shield 100 may be constructed from beryllium copper alloy and plated with tin. In other embodiments, the shield 100 may be constructed from an electrically conductive material such as, for example, metal (e.g., copper, silver, aluminum, steel), graphite, plasma, or any other conductive material.

The dimensions of the metal sheet 110 varies depending on the application; however, in one embodiment, the sheet 110 is sized and dimensioned to receive the HDMI connector 105 in between the first and second side walls 135, 140 and top planar surface 130. The sheet 110 has approximately a uniform thickness of 0.005 inches. The length (shown as "L1" in FIG. 5) and width (shown as "W1" in FIG. 5) of the top planar surface are approximately 0.625 inches and 0.400 inches, respectively. Each of the side walls 135, 140 has a length (shown as "L2" in FIG. 6) and width (shown as "W2" in FIG. 6) are approximately 0.450 inches and 0.200 inches, respectively. Each of the legs has a length (shown as "L3" in FIG. 6) and width (shown as "W3" in FIG. 6) is approximately 0.075 inches and 0.200, respectively. Other dimensions of the metal sheet 110 may vary depending on the application and size of the connector.

INDUSTRIAL APPLICABILITY

To solve the aforementioned problems, the present invention is a unique device for shielding radio frequency and EMI on an electronic device.

LIST OF ACRONYMS USED IN THE DETAILED DESCRIPTION OF THE INVENTION

The following is a list of the acronyms used in the specification in alphabetical order.
HDMI High-Definition Multimedia Interface
EMI Electromagnetic interference
RF Radio Frequency
EMP Electromagnetic pulses
SATA Serial AT attachment

ALTERNATE EMBODIMENTS

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. An electromagnetic shielding member for use on an HDMI connector, comprising:
   (a) a single sheet of metal having slots along an edge of the sheet to form a plurality of resilient fingers;
   (b) the single sheet of metal being bent around first and second bend axes inwardly and approximately ninety degrees to form a top planar surface (130) and first and second side walls, the single sheet of metal being sized and dimensioned to receive the HDMI connector in between the first and second side walls and top planar surface;
   (c) wherein the plurality of resilient fingers are formed along the edge of the top planar surface and first and second side walls and bent outward with a bend radius of approximately 0.020 inches with respect to a flat surface of the sidewalls and top planar surface, respectively, wherein the plurality of fingers applying a biasing force against a surface of a faceplate;
   (d) each of the side walls includes an elongated leg being interconnected with a circuit board, wherein each of the elongated legs extends beyond a bottom edge of each of the side walls;
   (e) wherein each leg is substantially perpendicular to the plurality of fingers on the respective side walls; and
   (f) wherein the single sheet of metal is composed of Beryllium Copper alloy, the Beryllium Copper alloy single sheet is plated with Tin and the Tin plated Beryllium Copper alloy has a uniform thickness of approximately 0.005 inches.

2. The shielding member of claim 1, wherein each leg is soldered onto the circuit board.

3. The shielding member of claim 1, wherein each leg is mechanically fastened onto the circuit board.

4. The shielding member of claim 1, wherein the plurality of resilient fingers make contact with the surface of the faceplate to provide a ground contact.

5. The shielding member of claim 1, wherein each of the plurality of resilient fingers is independently flexible.

6. The shielding member of claim 1, wherein each of the plurality of resilient fingers is able to transition between a non-flexed state and a flexed state, wherein the flexed state is when the finger biases the surface of the faceplate and the non-flexed state is when the finger has no force being applied to the finger.

7. The shielding member of claim 1, wherein the single sheet of metal is slideably mounted on the HDMI connector before being coupled to the circuit board in such a manner that each of the plurality of resilient fingers maintains contacts with the surface of the faceplate, thereby accommodating various thicknesses of the faceplate.

8. A shielding apparatus for use on an HDMI, comprising:
   (a) a tin plated beryllium copper alloy single sheet of metal having slots along an edge of the sheet to form a plurality of resilient fingers;
   (b) the single sheet of metal being bent around first and second bend axes inwardly and approximately ninety degrees to form a top planar surface and first and second side walls, the single sheet of metal being sized and dimensioned to receive the HDMI connector in between the first and second side walls and top planar surface;
   (c) wherein the plurality of resilient fingers are formed along the edge of the top planar surface and first and second side walls and bent outward with a bend radius of approximately 0.020 inches with respect to a flat surface of the sidewalls and top planar surface, respectively, wherein the plurality of fingers applying a biasing force against a surface of a faceplate;

(d) each of the side walls includes an elongated leg being interconnected with an opening of a circuit board, wherein each of the elongated legs extends beyond a bottom edge of each of the side walls;
(e) wherein each leg is substantially perpendicular to the plurality of fingers on the respective side walls; and
(f) wherein the single sheet of metal is composed of Beryllium Copper alloy, the Beryllium Copper alloy single sheet is plated with Tin and the Tin plated Beryllium Copper alloy has a uniform thickness of approximately 0.005 inches.

9. The shielding apparatus of claim 8, wherein each leg is soldered onto the circuit board.

10. The shielding apparatus of claim 8, wherein each leg is mechanically fastened onto the circuit board.

11. The shielding apparatus of claim 8, wherein the plurality of resilient fingers make contact with the surface of the faceplate to provide a ground contact.

12. The shielding apparatus of claim 8, wherein each of the plurality of resilient fingers is independently flexible.

13. The shielding apparatus of claim 8, wherein each of the plurality of resilient fingers is able to transition in between a non-flexed state to a flexed state, wherein the flexed state is when the finger biases the surface of the faceplate and the non-flexed state is when the finger has no force being applied to the finger.

14. The shielding apparatus of claim 8, wherein the single sheet of metal is slideably mounted on the HDMI connector before being coupled to the circuit board in such a manner that each of the plurality of resilient fingers maintains contacts with the surface of the faceplate, thereby accommodating various thicknesses of the faceplate.

\* \* \* \* \*